United States Patent
Muramoto et al.

(10) Patent No.: US 10,283,656 B2
(45) Date of Patent: May 7, 2019

(54) PHOTOELECTRIC CONVERSION DEVICE

(71) Applicant: KYOCERA Corporation, Kyoto-shi, Kyoto (JP)

(72) Inventors: Kazuya Muramoto, Daito (JP); Yuya Furukubo, Daito (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 15/762,030

(22) PCT Filed: Sep. 20, 2016

(86) PCT No.: PCT/JP2016/077696
§ 371 (c)(1),
(2) Date: Mar. 21, 2018

(87) PCT Pub. No.: WO2017/057095
PCT Pub. Date: Apr. 6, 2017

(65) Prior Publication Data
US 2018/0294369 A1    Oct. 11, 2018

(30) Foreign Application Priority Data
Sep. 28, 2015    (JP) ................................. 2015-189898

(51) Int. Cl.
*H01L 31/00* (2006.01)
*H01L 31/0352* (2006.01)
(Continued)

(52) U.S. Cl.
CPC ...... *H01L 31/035218* (2013.01); *B82Y 20/00* (2013.01); *C09K 11/02* (2013.01);
(Continued)

(58) Field of Classification Search
CPC .............................................. H01L 31/035218
See application file for complete search history.

(56) References Cited

U.S. PATENT DOCUMENTS

2007/0264488 A1    11/2007    Lee
2008/0110494 A1     3/2008    Reddy
(Continued)

FOREIGN PATENT DOCUMENTS

JP    2006-114815 A    4/2006
JP    2009-532851 A    9/2009
(Continued)

OTHER PUBLICATIONS

International Search Report (Form PCT/ISA/210) dated Dec. 13, 2016, issued in PCT/JP2016/077696, 4 pages.
(Continued)

*Primary Examiner* — Angelo Trivisonno
(74) *Attorney, Agent, or Firm* — Volpe and Koenig, P.C.

(57) ABSTRACT

A photoelectric conversion device includes a quantum dot layer formed by integrating a plurality of quantum dots on a main surface of a semiconductor substrate. The quantum dot layer contains not less than two types of organic molecules having different carbon numbers, among the quantum dots. The quantum dots are bonded to one another by lower-carbon-number organic molecules having a lower carbon number to form aggregates of the quantum dots. Higher-carbon-number organic molecules having a higher carbon number are bonded to the outer sides of the aggregates.

4 Claims, 3 Drawing Sheets

(51) Int. Cl.
*B82Y 20/00* (2011.01)
*C09K 11/02* (2006.01)
*C09K 11/66* (2006.01)
*C09K 11/88* (2006.01)

(52) U.S. Cl.
CPC .......... *C09K 11/661* (2013.01); *C09K 11/883* (2013.01); *H01L 31/0352* (2013.01); *Y10S 977/762* (2013.01); *Y10S 977/774* (2013.01); *Y10S 977/824* (2013.01); *Y10S 977/825* (2013.01); *Y10S 977/95* (2013.01)

(56) References Cited

U.S. PATENT DOCUMENTS

| | | |
|---|---|---|
| 2008/0092953 A1 | 4/2008 | Lee |
| 2011/0297218 A1 | 12/2011 | Lee |
| 2012/0175593 A1* | 7/2012 | Murayama ........ H01L 31/03521 257/13 |

FOREIGN PATENT DOCUMENTS

| | | |
|---|---|---|
| JP | 2009-537994 A | 10/2009 |
| JP | 2013-105952 A | 5/2013 |
| JP | 2015-103609 A | 6/2015 |
| WO | 2011037041 A1 | 3/2011 |

OTHER PUBLICATIONS

Written Opinion (Form PCT/ISA/237) dated Dec. 13, 2016, issued in PCT/JP2016/077696, 5 pages.

* cited by examiner

PHOTOELECTRIC CONVERSION DEVICE

TECHNICAL FIELD

The present invention relates to a photoelectric conversion device utilizing quantum dots.

BACKGROUND ART

In recent years, photovoltaic cells using quantum dots have been developed to further enhance photoelectric conversion efficiency of photovoltaic cells (for example, see Patent Document 1). FIG. 3 is a schematic partial cross-sectional view of a known photoelectric conversion device exemplifying a quantum dot photovoltaic cell. The photoelectric conversion device illustrated in FIG. 3 includes a semiconductor substrate 101 and a quantum dot layer 103 disposed on the semiconductor substrate 101. The quantum dot layer 103 is constituted by quantum dots 103a being semiconductor particles and an inorganic matrix 103b disposed around the peripheries of the quantum dots 103a.

CITATION LIST

Patent Literature

Patent Document 1: JP 2006-114815 A

SUMMARY OF INVENTION

A photoelectric conversion device of the present disclosure includes a semiconductor substrate and a quantum dot layer formed by integrating a plurality of quantum dots on a main surface of the semiconductor substrate. The quantum dot layer contains not less than two types of organic molecules having different carbon numbers, among the plurality of quantum dots.

DESCRIPTION OF EMBODIMENT

Figure 3:
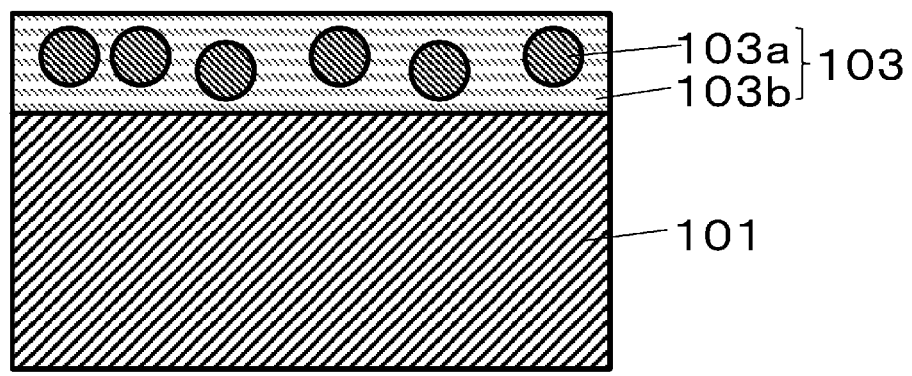
FIG. 3 is a schematic partial cross-sectional view of a known photoelectric conversion device exemplifying a quantum dot photovoltaic cell.

For example, in the photoelectric conversion device illustrated in FIG. 3, the quantum dots 103a and the matrix 103b in the quantum dot layer 103 often have a large difference in thermal expansion coefficient due to their materials. In a case where a plurality of such quantum dot layers 103 are formed on the semiconductor substrate 101, difference in thermal expansion coefficient between the quantum dot layers 103 and the semiconductor substrate 101 may cause significant distortion in the quantum dot layer 103 on the semiconductor substrate 101 side.

The difference in thermal expansion coefficient between the quantum dots 103a and the matrix 103b itself also causes distortion in the quantum dot layer 103 on a side where sunlight is incident, the side opposite to the semiconductor substrate 101 side in the quantum dot layer 103, in many cases.

In such a case, in a case where the quantum dot layer 103 formed on a main surface of the semiconductor substrate 101 has a large surface area, the distortion increases in proportion to the surface area of the quantum dot layer 103, resulting in prevention of variations in energy levels acquired as a result of quantum confinement effect or continuity of a band structure. Consequently, carriers generated in the quantum dot layers 103 are difficult to be taken out, and power generation efficiency is difficult to be enhanced. The present disclosure is conceived in the light of these problems. Power generation efficiency can be enhanced with the configuration described below.

Figure 1A:
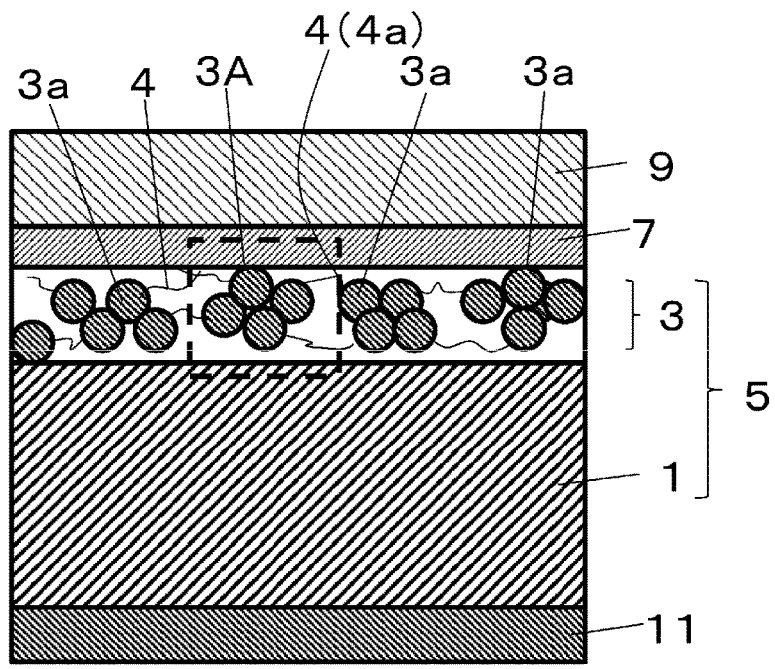
FIG. 1A is a schematic cross-sectional view of one embodiment of a photoelectric conversion device of the present disclosure.
Figure 1B:
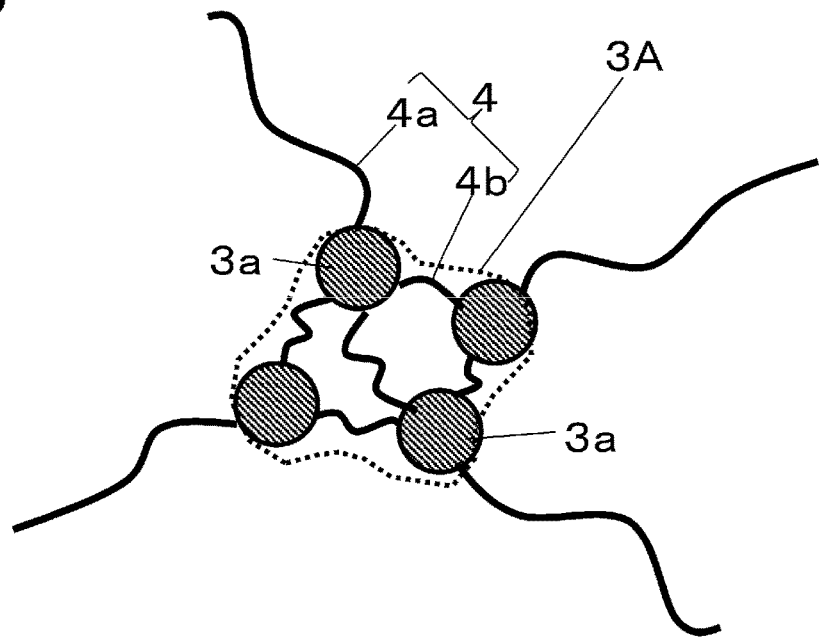
FIG. 1B is an enlarged schematic view of a quantum dot aggregate illustrated in the dashed-line frame of FIG. 1A.

FIG. 1A is a schematic cross-sectional view of one embodiment of a photoelectric conversion device of the present disclosure. FIG. 1B is an enlarged schematic view of a quantum dot aggregate illustrated in the dashed-line frame of FIG. 1A.

The photoelectric conversion device of the present disclosure includes, as a photoelectric conversion layer 5, a semiconductor substrate 1 and a quantum dot layer 3 disposed on a top surface side of the semiconductor substrate 1. A glass substrate 9 is adhered on a top surface side of the photoelectric conversion layer 5 with a transparent electrically conductive film 7 disposed therebetween. An electrode layer 11 is disposed on a bottom surface side of the photoelectric conversion layer 5. In this case, sunlight is incident on the glass substrate 9 side and exits on the electrode layer 11 side. In FIG. 1A, only one quantum dot layer 3 formed on the semiconductor substrate 1 is illustrated for the sake of simplification; however, at least several tens of the quantum dot layers 3 are laminated in the structure. The quantum dot layer 3 contains not less than two types of organic molecules 4 having different carbon numbers among a plurality of quantum dots 3a.

Unlike the inorganic matrix illustrated in FIG. 3, the quantum dots 3a integrated in the quantum dot layers 3 in the photoelectric conversion device of the present disclosure are connected by the organic molecules 4 having a lower elastic modulus than the inorganic matrix. This structure reduces rigidity of the quantum dot layers 3 as a whole. This structure also reduces distortion occurring due to a difference in thermal expansion coefficient between the quantum dot layers 3 and the semiconductor substrate 1. Consequently, continuity of a band structure in the quantum dot layers 3 are readily maintained. Thus, carriers generated in the quantum dot layers 3 are readily taken out, and power generation efficiency can be enhanced.

The structure in which the quantum dots 3a are bonded to the organic molecules 4 is effective in a case where a difference in thermal expansion coefficient between the quantum dot layers 3 and the semiconductor substrate 1 of the photoelectric conversion layer 5 is not less than $1 \times 10^{-6}/°$C., and particularly not less than $2 \times 10^{-6}/°$C. The semiconductor substrate 1 may be, for example, one type suitably selected from the group consisting of Si (CTE: 3.6 to $4.1 \times 10^{-6}$/K), GaAs (CTE: 5.5 to $6.5 \times 10^{-6}$/K), InP (4.1 to $4.8 \times 10^{-6}$/K), and GaN (CTE: 3.1 to $5.8 \times 10^{-6}$/K). In this case, guidelines for the selection are that the semiconductor substrate 1 has a lattice constant and a thermal expansion coefficient close to the lattice constant and the thermal expansion coefficient of semiconductor particles constituting the quantum dots 3a and that the band gap is small.

As described above, the quantum dots 3a are bonded to the organic molecules 4 having different carbon numbers in the quantum dot layers 3. In this case, the organic molecules 4 having a lower carbon number are present so as to bring the plurality of quantum dots 3a close to one another and to bond the quantum dots 3a to one another. Accordingly, aggregates 3A are each formed by gathering a plurality of quantum dots 3a. In this case, the organic molecules 4 having a lower carbon number around the peripheries of the quantum dots 3a function as a passivation film. This configuration enhances confinement effect of carriers generated in the quantum dots 3a and increases short-circuit current density (Jsc).

In the quantum dot layers 3, each of the aggregates 3A of the quantum dots 3a formed by bonding a plurality of quantum dots 3a to the organic molecules 4 forms a unit, and the aggregates 3A are connected to one another by the organic molecules 4. In FIG. 1A, only organic molecules 4 (4a) extending outward from the aggregates 3A are illustrated because of the size of the drawing; however, the aggregates 3A include therein organic molecules 4b connecting adjacent quantum dots 3a to one another as illustrated in FIG. 1B. The aggregates 3A are connected to one another by the organic molecules 4a extending outward. The organic molecules 4a and the organic molecules 4b have different numbers of carbon atoms being elements constituting a main chain. Hereinafter, the organic molecules 4a are referred to as higher-carbon-number organic molecules 4a because these organic molecules 4 have a higher carbon number than the organic molecules 4b. On the other hand, the organic molecules 4b are referred to as lower-carbon-number organic molecules 4b because these organic molecules 4 have a lower carbon number than the higher-carbon-number organic molecules 4a. Note that the carbon numbers may be different among the higher-carbon-number organic molecules 4a and among the lower-carbon-number organic molecules 4b.

The lower-carbon-number organic molecules 4b composing the aggregates 3A preferably are organic molecules 4 having a carbon number of not higher than 20 to increase the degree of integration between the quantum dots 3a. At this time, the lower-carbon-number organic molecules 4b bonding the quantum dots 3a to one another and the higher-carbon-number organic molecules 4a bonding the aggregates 3A to one another have significantly different carbon numbers. For example, the higher-carbon-number organic molecules 4a preferably have a carbon number not lower than 1.5 times the carbon number of the lower-carbon-number organic molecules 4b. In a case where the ratio of the carbon number of the higher-carbon-number organic molecules 4a to the carbon number of the lower-carbon-number organic molecules 4b is not lower than 1.5, the lower-carbon-number organic molecules 4b preferentially connect the quantum dots 3a to one another. On the other hand, the higher-carbon-number organic molecules 4a preferentially connect the aggregates 3A to one another. Since the quantum dots 3a are connected to one another mainly by the lower-carbon-number organic molecules 4b, quantum effect of the quantum dots 3a is readily exhibited. On the other hand, the plurality of aggregates 3A are connected to one another mainly by the higher-carbon-number organic molecules 4a, resulting in reduction in rigidity of the quantum dot layers 3.

Various hydrocarbons of methane series in which the carbon skeleton has a chain structure and that has a carbon number of not higher than 20 can be preferably used as the organic molecules 4. Specific examples include pentene (5 carbon atoms), hexane (6 carbon atoms), heptane (7 carbon atoms), dodecene (12 carbon atoms), and octadecene (17 carbon atoms). Among these, a preferable combination is one of octadecene and dodecene as the higher-carbon-number organic molecules 4a and one of pentene and hexane as the lower-carbon-number organic molecules 4b. With this combination, the ratio of the carbon number of the higher-carbon-number organic molecules 4a to the carbon number of the lower-carbon-number organic molecules 4b is not less than 2. This configuration can increase short-circuit current density (Jsc) of the photoelectric conversion device.

The quantum dots 3a may have any shape, for example, a round shape such as an ellipse and a sphere, a hexahedral shape such as a cube and a rectangular prism, a thin film shape, and a wire shape, and preferably have one of a round shape and a polyhedral shape having an aspect ratio of approximately 1 (1 to 1.5) to readily form a three-dimensionally continuous band structure with adjacent quantum dots 3a.

The quantum dots 3a having a wire shape (quantum wire) can also yield short-circuit current density equivalent to that of the aforementioned polyhedral shape having an aspect ratio of approximately 1 (1 to 1.5) because conductivity of carriers in the quantum wires is enhanced. In this case, the quantum wires preferably have both ends having different diameters. The quantum wires having both ends having different diameters provide quantization level distribution in the length direction, so that light of a shorter wavelength is absorbed in a region of a smaller diameter where the quantization level is higher, and light of a longer wavelength is absorbed in a region of a larger diameter where the quantization level is lower. This indicates that each of the quantum wires can absorb light of different wavelengths, so that further increased short-circuit current density can be yielded. In this case, the quantum wires having a diameter decreasing in the length direction are preferably contained not less than 10% of the total of the quantum dots 3a by number in a unit surface area in a cross-sectional view of the quantum dot layer 3.

Concerning the dimension of the quantum dots 3a, in a case where the quantum dots 3a have a round or thin film shape, for example, the maximum diameter is preferably 3 nm to 50 nm. In a case where the quantum dots 3a have a wire shape, the diameter of the wires (quantum wires) is preferably 3 to 50 nm, and the length is preferably 100 to 10000 nm. The gap between the quantum dots 3a in the aggregates 3A, that is, the length of the lower-carbon-number organic molecules 4b present between the quantum dots 3a is preferably from 2 to 10 nm.

In a case where the dimension of the quantum dots 3a composing the aggregates 3A and the gap between the quantum dots 3a satisfy the above-described ranges, an ordered long period structure of electrons can be readily formed between the plurality of quantum dots 3a in the aggregates 3A. This enables formation of a continuous band structure. Note that the dimension of the quantum dots 3a and the gap between the quantum dots 3a may be adjusted under conditions of a specific application and a device to be manufactured.

The quantum dots 3a are mainly composed of semiconductor particles and preferably have an energy gap (Eg) of 0.15 to 1.20 ev. Specifically, the quantum dots 3a are preferably made from any one of germanium (Ge), silicon (Si), gallium (Ga), indium (In), phosphorus (P), zinc (Zn), arsenic (As), antimony (Sb), copper (Cu), iron (Fe), sulfur (S), lead (Pb), tellurium (Te), and selenium (Se), and a compound semiconductor thereof.

Figure 2:
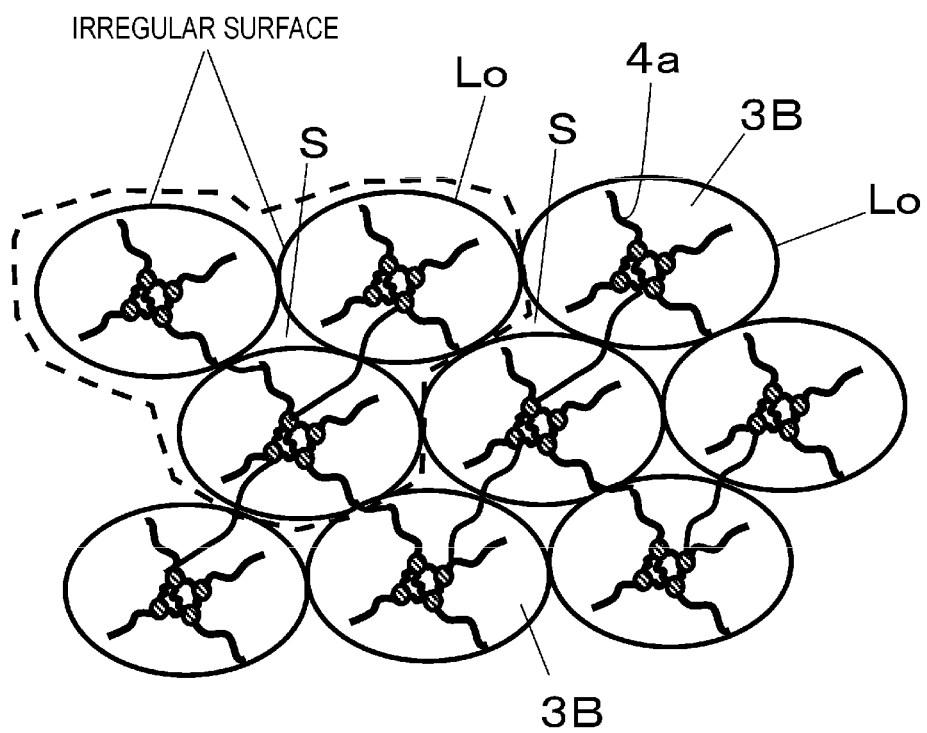
FIG. 2 is a schematic view illustrating a state in which aggregates of quantum dots are connected to and integrated with one another by higher-carbon-number organic molecules.

FIG. 2 is a partial schematic view of the quantum dot layer in a state in which the aggregates of the quantum dots are connected to one another by the higher-carbon-number organic molecules. In FIG. 2, each of the aggregates 3A with the higher-carbon-number organic molecules 4a present around the peripheries of the aggregates 3A is enclosed with a circle and expressed as a complex 3B of the quantum dots; however, the higher-carbon-number organic molecules 4a are actually present so as to fill gaps (S) between the aggregates 3A in a longitudinal cross-sectional or plan view of the quantum dot layer 3. In FIG. 2, a region where a plurality of (three in this case) complexes 3B are adjacent is enclosed is illustrated with a dashed line. In this case, the three adjacent complexes 3B are arranged so that a triple point is formed at the center. The complexes 3B may have varying dimensions within a range of 0.5 to 2 with the average dimension being expressed as 1. In a case where the complexes 3B have varying dimensions, a gap between larger complexes 3B is filled with a smaller complex 3B, thereby increasing the filling rate of the complexes 3B. This configuration increases the degree of integration of the complexes 3B and the amount of carries generated. Furthermore, short-circuit current density (Jsc) can also be increased.

The aggregates 3A are complex structures formed by gathering a plurality of quantum dots 3a densely. When a reflected electron image of a cross section of the quantum dot layer 3 is observed with an electron microscope, hues are different for the aggregates 3A where the quantum dots 3a are gathered densely and the higher-carbon-number organic molecules 4a, so that they can be distinguished. In this case, the actual contour Lo of each of the complexes 3B passes through center points between two adjacent aggregates 3A and defines a region by connecting the center points around the aggregate 3A. The higher-carbon-number organic molecules 4a and the lower-carbon-number organic molecules 4b can be distinguished by observation with a scanning tunneling microscope.

In a case where the cross section illustrated in FIG. 2 indicates a frontmost surface and its vicinity of the quantum dot layers 3, that is, in a case where the complexes 3B are laminated, the frontmost surface of the complexes 3B has irregularities due to a difference in density between the quantum dots 3a composing the complexes 3B. In a case where the organic molecules 4 are removed from the complexes 3B (or the quantum dot layers 3) in this case, irregularities formed by the quantum dots 3a causes a front surface of the complexes 3B to be curved. In a case where the front surface of the complexes 3B is irregularly curved in this way, sunlight can be received perpendicularly at a spot of the curved surface even with varying orientations of the sun. This configuration can reduce a decrease in the intensity of sunlight projected on the front surface of the quantum dot layers 3 and can thus provide a photoelectric conversion device having high photoelectric conversion efficiency.

EXAMPLES

Next, examples of the photoelectric conversion device of the present disclosure prepared with specific material and their evaluation will be described. First, a solution of organic molecules including not less than one type of organic molecules 4 having different carbon numbers was prepared in a predetermined container. Pentene (5 carbon atoms), hexane (6 carbon atoms), heptane (7 carbon atoms), dodecene (12 carbon atoms), and octadecene (17 carbon atoms) were used as the organic molecules 4. When two types of the organic molecules 4 were used, the composition was adjusted so that the numbers of moles were equal. Acetone was used as a solvent. The solvent may be required to be changed depending on the type of the organic molecules 4. Other than acetone, any of organic solvent selected from toluene, isopropyl alcohol, ethanol, methanol, and the like can be used similarly.

Next, semiconductor particles (here, lead sulfide (PbS)) having a thermal expansion coefficient of $19 \times 10^{-6}/°$ C. and an average particle diameter of 5 nm) to be quantum dots 3a were loaded into the prepared solution of the organic molecules, and the resultant solution was agitated for approximately seven days at room temperature. The added amount of the organic molecules 4 was adjusted so that the mass ratio of the semiconductor particles to the organic molecules 4 was 1 to 5.

In this case, agitation operation for a long period created a state in which lower-carbon-number organic molecules 4b were bonded on the front surface of the quantum dots 3a and only a certain number (several tens to several thousands) of the quantum dots 3a were aggregated. In the case of two types of the organic molecules 4, higher-carbon-number organic molecules 4a having a higher carbon number were mainly bonded around the peripheries of the aggregates 3A of the quantum dots 3a. Precursors of the aggregates 3A were formed in the resultant solution of the organic molecules. At this time, the solution of the organic molecules containing the precursors of the aggregates 3A had thixotropic viscosity.

Next, a semiconductor substrate (in this case, a silicon substrate) 1 (having a thermal expansion coefficient of $4 \times 10^{-6}/°$ C.) was prepared that had a main surface on one side on which a gold vapor-deposited film was preliminarily formed as an electrode layer 11. The silicon substrate had a thickness of 100 μm and a surface area of 10 mm×10 mm.

Next, the solution of the organic molecules containing the precursors of the aggregates 3A was applied onto a main surface, with no electrode layer 11 formed thereon, of the silicon substrate 1 by a common technique (spin coating). Then, the solvent was dried, thereby forming a film of integrated aggregates 3A of the quantum dots 3a (quantum dot layers 3) on the silicon substrate. The quantum dot layers 3 thus formed had a thickness of approximately 0.1 μm.

Thereafter, a transparent electrically conductive film 7 made from indium tin was formed on the front surface of the quantum dot layers 3 formed on the silicon substrate, by vapor deposition. Finally, a glass substrate 9 was adhered to the front surface of the transparent electrically conductive film 7 with an adhesive, thereby acquiring the photoelectric conversion device of the present disclosure.

Next, the prepared samples of the photoelectric conversion device were processed, and cross sections of the samples were observed with a transmission electron microscope. Among the prepared samples, samples prepared using two types of organic molecules had the aggregates 3A in the quantum dot layers 3 in a laminated state as illustrated in FIG. 2. When observed before forming the transparent electrically conductive film 7, the front surface of the quantum dot layers 3 had an irregularly curved shape. Furthermore, the aggregates 3A were analyzed with a time-of-flight secondary ion mass spectrometer (TOF-SIMS) in addition to the transmission electron microscope, and the analysis confirmed that the lower-carbon-number organic molecules 4b were present mainly in the aggregates 3A and that the higher-carbon-number organic molecules 4a were present mainly around the peripheries of the aggregates 3A.

The electrode layer 11 and the transparent electrically conductive film 7 of each of the prepared photoelectric conversion devices were connected to each other, and short-circuit current density was measured. The results are shown in Table 1.

Instead of the quantum dots 3a, quantum wires made from ZnTe (having an average diameter of 3 nm and an average length of 1500 nm) were prepared by pulse electrolysis. In this case, quantum wires having a diameter decreasing in the length direction were contained 10% by number.

Next, a solution was prepared similarly by adding organic molecules and the semiconductor particles (PbS), a photoelectric conversion device having an integration film (quantum dot layers 3) having substantially the same thickness on a silicon substrate was prepared, and the same evaluation was conducted.

TABLE 1

| Sample No. | Organic molecule | Carbon number ratio | Short-circuit current density (Jsc) (mA/cm$^2$) |
| --- | --- | --- | --- |
| 1 | Pentene (C5) | — | 5.4 |
| 2 | Hexane (C6) | — | 5.5 |
| 3 | Octadecene (C17) | — | 3.6 |
| 4 | Dodecene (C12)/Heptane (C7) | 1.7 | 8.5 |
| 5 | Dodecene (C12)/Pentene (C5) | 2.4 | 10.6 |
| 6 | Octadecene (C17)/Pentene (C5) | 3.4 | 11.6 |
| 7 | Dodecene (C12)/Hexane (C6) | 2 | 10.1 |
| 8 | Octadecene (C17)/Hexane (C6) | 2.8 | 11.3 |

As is apparent from Table 1, the samples (Nos. 4 to 8) prepared using the higher-carbon-number organic molecules and the lower-carbon-number organic molecules as organic molecules had short-circuit current densities (Jsc) of not less than 8.5 mA/cm$^2$, which were higher than the short-circuit current densities (Jsc) of the samples (Nos. 1 to 3) using only one type of organic molecule.

Among these samples, the samples (Nos. 5 to 8) having carbon number ratio (higher-carbon-number organic molecules/lower-carbon-number organic molecules) of not less than 2 of the higher-carbon-number organic molecules to the lower-carbon-number organic molecules had short-circuit current densities (Jsc) of not less than 10.1 mA/cm$^2$.

Concerning the samples prepared by using the ZnTe quantum wires instead of the PbS for the quantum dots 3a of Sample Nos. 1 to 8 in Table 1, electromotive force was detected from all of the samples, and their short-circuit current densities were equivalent to those of the Sample Nos. 1 to 8.

It is conceived that two types of organic molecules having different carbon numbers being present in the quantum dot layers 3, reduction in distortion in the photoelectric conversion layer 5, and an effective passivation film formed around the peripheries of the quantum dots 3a enhanced confinement effect of carriers in the quantum dots 3a, thereby achieving these results.

REFERENCE SIGNS LIST 1, 101 Semiconductor substrate
3, 103 Quantum dot layer
3a, 103a Quantum dot
3A Aggregate
3B Complex
4 Organic molecule
4a Higher-carbon-number organic molecule
4b Lower-carbon-number organic molecule
5 Photoelectric conversion layer
7 Transparent electrically conductive film
9 Glass substrate
11 Electrode layer

The invention claimed is:

1. A photoelectric conversion device comprising:
   a semiconductor substrate;
   a plurality of quantum dots that are bonded to one another by first organic molecules to form aggregates;
   second organic molecules that are bonded to outer sides of the aggregates to form a confinement layer, wherein the second organic molecules have a higher carbon number than the first organic molecules; and
   a quantum dot layer formed by integrating the confinement layer on a main surface of the semiconductor substrate.

2. The device according to claim 1, wherein the second organic molecules connect a plurality of the aggregates to one another.

3. The device according to claim 1, wherein
   the first organic molecules and the second organic molecules have a carbon number of not greater than 20; and
   the second organic molecules have a carbon number not lower than 1.5 times a carbon number of the first organic molecules.

4. The device according to claim 1, wherein
   the second organic molecules are one of octadecene and dodecene; and
   the first molecules are one of pentene and hexane.

* * * * *